US006469358B1

United States Patent
Martin

(10) Patent No.: US 6,469,358 B1
(45) Date of Patent: Oct. 22, 2002

(54) THREE COLOR QUANTUM WELL FOCAL PLANE ARRAYS

(75) Inventor: Robert J. Martin, Orlando, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 29 days.

(21) Appl. No.: 09/666,847

(22) Filed: Sep. 21, 2000

(51) Int. Cl.[7] .................. H01L 31/0304; H01L 31/0224
(52) U.S. Cl. ..................... 257/440; 257/21; 257/184; 257/448; 257/459
(58) Field of Search ................... 257/21, 184, 440, 257/448, 459

(56) References Cited

U.S. PATENT DOCUMENTS

| | | |
|---|---|---|
| 4,903,101 | 2/1990 | Maserjian |
| 4,956,686 | 9/1990 | Borrello et al. |
| 5,013,918 | 5/1991 | Choi |
| 5,023,685 | * 6/1991 | Bethea et al. ............. 257/440 |
| 5,047,822 | 9/1991 | Little, Jr. et al. |
| 5,198,659 | 3/1993 | Smith et al. |
| 5,300,780 | 4/1994 | Denney et al. |
| 5,355,000 | 10/1994 | Delacourt et al. |
| 5,384,469 | 1/1995 | Choi |
| 5,479,032 | * 12/1995 | Forrest et al. ............. 257/440 |
| 5,488,504 | 1/1996 | Worchesky et al. |
| 5,539,206 | 7/1996 | Schimert |
| 5,629,522 | 5/1997 | Martin et al. |
| 5,965,899 | 10/1999 | Little, Jr. |

OTHER PUBLICATIONS

W.A. Beck et al., "Imaging Performance of 256x256 LWIR Miniband Transport Multiple Quantum Well Focal Plane Arrays", pp. 1–14, Proc. Second Int. Symp. 2–20 μm Wavelength Infrared Dets. and Arrays: Phys. and Appl., Oct. 10–12, 1994, Miami Beach, Florida.

Lester J. Kozlowksi, et al., "LWIR 128 + 128 GaAs/AlGaAs Multiple Quantum Well Hybrid Focal Plane Array", IEEE Translation on Electron Devices, vol. 38, No. 5, May 1991, pp. 1124–1130.

A. Köck, et al., "Double Wavelength Selective GaAs/AlGaAs Infrared Detector Device", Applied Physics Letters 60(16), Apr. 20, 1992, pp. 2011–2013.

I. Gravé, et al., "Voltage–Controlled Tunable GaAs/AlGaAs Multistack Quantum Well Infrared Detector", Applied Physics Letters 60 (19), May 11, 1992, pp. 2362–2364.

E. Martinet, et al., Switchable Bicolor (5.5–9.0 μm) Infrared Detector Using Asymmetric GaAs/AlGaAs Multiquantum Well, Applied Physics Letters 61(3), Jul. 20, 1992, pp. 246–248.

(List continued on next page.)

Primary Examiner—Jerome Jackson
(74) Attorney, Agent, or Firm—Burns, Doane, Swecker & Mathis, LLP

(57) ABSTRACT

Exemplary embodiments of the present invention use a vertically stacked quantum well infrared detector where each "tuned" quantum well of the detector can be biased separately from any other quantum well of the detector. The vertically stacked detector can include three or more quantum well layers that are "tuned" to different peak wavelengths to permit detection of infrared radiation of three or more different bands or colors. The simultaneous detection of infrared radiation in three or more different spectral bands permits the determination of more information about an infrared source.

17 Claims, 3 Drawing Sheets

OTHER PUBLICATIONS

K. Kheng, et al., "Two–Color GaAs/(AlGa)As Quantum Well Infrared Detector With Voltage–Tunable Spectral Sensitivity At 3–5 and 8–12 μm", Applied Physics Letters 61(16), Aug. 10, 1992, pp. 666–668.

K.L. Tsai, et al., "Two–Color Infrared Photodetector Using GaAs/AlGaAs and Strained InGaAs/AlGaAs Multiquantum Wells", Applied Physics Letters 62 26 , Jun. 28, 1993, pp. 3504–3506.

B.F.Levine, "Quantum–Well Infrared Photodetectors", Jornal of Applied Physics 74 (8), Oct. 15, 1993, pp. 1–87.

C.G. Bethea, et al., "Long Wavelength Infrared 128 + 128 $Al_xGa_{1-x}As$/GaAs Quantum Well Infrared Camera and Imaging System", IEEE Transactions on Electron Devices, vol. 40, No. 11, Nov. 1993, pp. 1957–1963.

G. Sarusi, et al., "Improved Performance of Quantum Well Infrared Photodetectors Using Random Scattering Optical Coupling", Applied Physics Letters 64 (8), Feb. 21, 1994, pp. 960–962.

Y.H. Wang, et al., "A GaAs/AlAs/AlGaAs and GaAs/AlGaAs Stacked Quantum Well Infrared Photodetector For 3–5 and 8–14 μm Detection", Journal of Applied Physics 76(4), Aug. 15, 1994, pp. 2538–2540.

M.Z. Tidrow, et al., "Grating Coupled Multcolor Quantum Well Infrared Photodetectors", Applied Physics Letters 67 (13), Sep. 25, 1995, pp. 1800–1802.

C.J. Chen, et al., Corrugated Quantum Well Infrared Photodetectors For Normal Incident Light Coupling, Applied Physics Letter 68 (11), Mar. 11, 1996, pp. 1446–1448.

T.R. Schimert, et al., "Enhanced Quantum Well Infrared Photodetor With Novel Multiple Quantum Well Grating Structure", Applied Physics Letters 68 (20), May 13, 1996, pp. 2846–2848.

* cited by examiner

THREE COLOR QUANTUM WELL FOCAL PLANE ARRAYS

The present application is related to application Ser. No. 09/666,301, entitled "Two Color Quantum Well Focal Plane Arrays," application Ser. No. 09/666,297, entitled "Remote Temperature Sensing Long Wavelength Modulated Focal Plane Array, application Ser. No. 09/665,959, entitled "Clutter Discriminating Focal Plane Array," application Ser. No. 09/666,828, entitled "Programmable Hyper-Spectral Infrared Focal Plane Array," and application Ser. No. 09/666,296, entitled "Large Dynamic Range Focal Plane Array," all filed on an even date herewith. The disclosures of the above identified Patent Applications are herein incorporated by reference.

BACKGROUND OF THE INVENTION

1. Field of the Invention

The present invention is directed generally to quantum well infrared photodetector focal plane arrays (QWIP FPA's) and, more particularly, to QWIP FPAs that are capable of multicolor detection.

2. Background Information

Multicolor infrared detection capability has wide applicability to a number of different applications including aerospace, medical, surveying, mining, and agriculture. For example, multicolor infrared detection can provide useful information during geographical surveys. Detection in at least two infrared (IR) spectral bands would permit differentiation between man-made structures and natural landscape in a geographical survey. Additionally, in medical applications, multi-color detection would permit improved thermal imaging of the human body for diagnostic purposes.

Multicolor infrared detection has been conventionally performed using a wide-band IR detector and an associated rotating mechanical multicolor filter wheel. The wide-band IR detector detects a broad range of incident wavelengths. The rotating filter wheel selects the desired wavelength that is to be passed to the wide-band detector. An exemplary mechanical color filter wheel system is disclosed in U.S. Pat. No. 5,300,780. Mechanical color wheel systems, however, suffer from a number of deficiencies in multicolor detection. Such systems generally are slow and bulky, require large amounts of power for operation, and have a limited life span. Additionally, color wheel systems tend to have poor photon collection efficiency.

To alleviate some of the known deficiencies of mechanical color filter wheel systems, quantum well photodetectors have been constructed that permit the detection of more than one spectral band. Such detectors are described, for example, in U.S. Pat. Nos. 5,013,918, 5,198,659, and 5,384,469. These patents generally disclose the use of a plurality of quantum well sets within a single detector where the frequency response characteristics of each quantum well in the set are tailored by adjusting the well depths. The detectors in these patents are designed for use with a single bias voltage that is applied across all the quantum wells of the set. Thus, each quantum well that is "tuned" to a specific frequency band can not have its bias adjusted independently of any other "tuned" quantum well in the set. The output voltage responses for each of the "colors" in the detector will therefore be nonuniform for any given background photon flux. In addition, the detectors of these patents provide only a single detected output signal composed of multi-spectral frequency components. Extraction of different frequency bands from the single output therefore requires additional filtering.

Accordingly, there exists a need in the art for a quantum well photodetector that has multi-color capability but which can also provide independent bias adjustment for each color and which can independently and simultaneously process the outputs of each of the colors of the detector.

SUMMARY OF THE INVENTION

Exemplary embodiments of the present invention use a vertically stacked quantum well infrared detector where each "tuned" quantum well of the detector can be biased separately from any other quantum well of the detector. The vertically stacked detector can include three or more quantum well layers that are "tuned" to different peak wavelengths to permit detection of infrared radiation of three or more different bands or colors. The simultaneous detection of infrared radiation in three or more different spectral bands permits the determination of more information about an infrared source.

The present invention is directed to a photodetector comprising: a first photosensitive layer; a second photosensitive layer; a third photosensitive layer, wherein said photosensitive layers are formed adjacent one another; and means for independently biasing said first, second, and third photosensitive layers. The present invention is additionally directed to a method of fabricating such a photodetector and fabricating a focal plane array including a plurality of such photodetectors.

In alternate embodiments, a photodetector according to the present invention comprises: first means responsive to impinging energy of a first spectral band for providing a first quantity of moving charges to a first output of said photodetector, second means responsive to impinging energy of a second spectral band for providing a second quantity of moving charges to a second output of said photodetector, wherein said impinging energy of said second spectral band first passes through said first means before reaching said second means; and third means responsive to impinging energy of a third spectral band for providing a third quantity of moving charges to a third output of said photodetector, wherein said impinging energy of said third spectral band first passes through said second means before reaching said third means.

BRIEF DESCRIPTION OF THE DRAWINGS

Other objects and advantages of the invention will be apparent to those skilled in the art reading the following detailed description of the preferred embodiments in conjunction with the drawings in which like reference numbers have been used to indicate like elements, and wherein.

DETAILED DESCRIPTION OF THE PREFERRED EMBODIMENTS

Multicolor detection in exemplary embodiments of the invention is achieved by adjusting the depths of the one or more quantum wells associated with each spectral band of a detector. Based on well known physical principles, the vertical depth of the one or more quantum wells comprising a photosensitive layer of a detector determines the energy required from impinging photons to permit carriers in the one or more wells to escape for conduction. The vertical depth of each quantum well thus determines the spectral response of the photosensitive layer to radiation in the form of impinging photons of various wavelengths. The allowed energy states in a quantum well are:

$$E_n = \frac{h^2 n^2}{8ml^2} \text{ Joules} \qquad \text{Eqn. (1)}$$

where h is Planck's constant=$6.626 \times 10^{-34}$ Joule*seconds
m is the effective mass of the carrier
n is an integer n=1, 2, 3 . . .
$E_n$ is the energy of a given band in Joules
l is the depth of the quantum well in meters.

For a carrier to move between the valence band (n=1) and the conduction band (n=2), the following energy $E_{1,2}$ is required to free the carrier from the valence band:

$$E_{1,2} = E_g = \frac{h^2(2^2 - 1^2)}{8ml^2} = \frac{3h^2}{8ml^2} \text{ Joules} \qquad \text{Eqn. (2)}$$

The energy required to free the carrier from the valence band to the conduction band ($E_{1,2}$) is alternatively called the energy gap, $E_g$. The energy given up by an impinging photon must be equal to or larger than the energy gap ($E_g$). Photon energy ($E_p$) is related to the wavelength of the photon by the following:

$$E_p = \frac{hc}{\lambda_p} \text{ Joules} \qquad \text{Eqn. (3)}$$

where h is Planck's constant=$6.626 \times 10^{-34}$ Joule*seconds
c is the velocity of light=$3 \times 10^8$ meters/second (in a vacuum)
$\lambda_p$ is the peak wavelength corresponding to the middle of the band in meters.

By setting the photon energy ($E_p$) equal to the energy gap ($E_g$) between the bands, the relationship of the well depth to the peak wavelength needed to free carriers is demonstrated:

$$\lambda_p = \frac{8mcl^2}{3h} \text{ meters} \qquad \text{Eqn. (4)}$$

Equation 4 is based on a general model, and those skilled in the art will recognize that other factors can influence the proportionality constant between wavelength and well depth. However, the peak wavelength can generally be considered proportional to the well depth:

$$\lambda_p = a_o l^2 \text{ meters} \qquad \text{Eqn. (5)}$$

where $\alpha_o$ is a proportionality constant

Thus, as is apparent from Equation 5, the spectral response of a quantum well layer can be "tuned" to the desired peak wavelength by adjusting the depths of the one or more wells comprising the layer.

Figure 1:
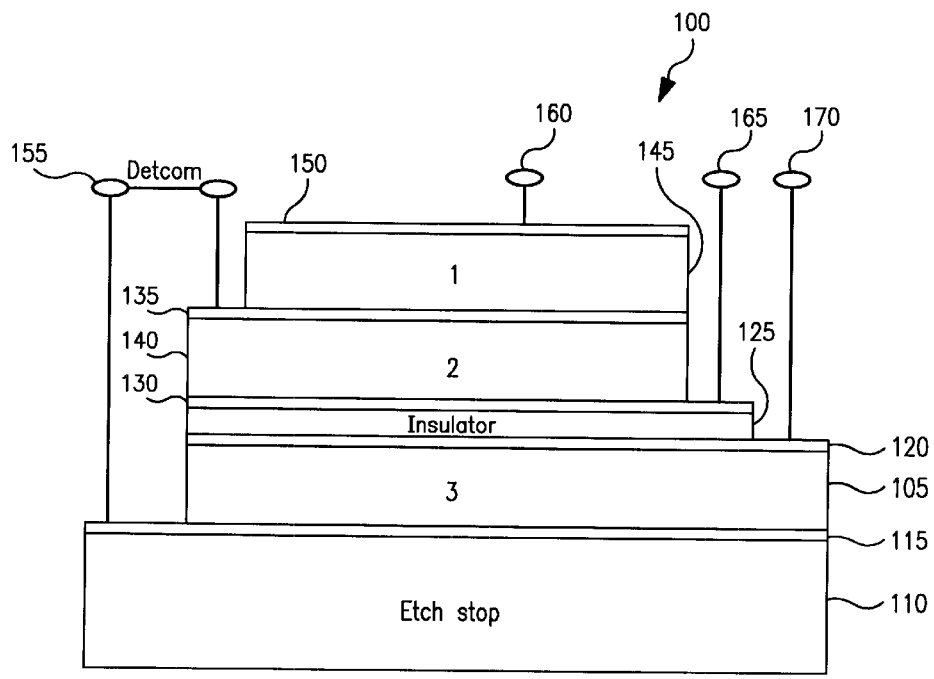
FIG. 1 is a structural diagram of a three color quantum well detector in accordance with an exemplary embodiment of the present invention.

FIG. 1 illustrates an exemplary embodiment of a three color detector 100 in accordance with the invention where three vertically stacked photosensitive layers have been "tuned" to different spectral bands or "colors" by adjustment of the depths of the quantum wells comprising each photosensitive layer of the detector. This three color detector is formed using a first means responsive to impinging energy, or radiation, of a first spectral band, represented in the FIG. 1 embodiment as quantum well layer 105. Quantum well layer 105, comprising one or more quantum wells of a first depth, is layered over a second means responsive to impinging energy, or radiation, of a second spectral band, represented in the FIG. 1 embodiment as second quantum well layer 140 comprising one or more quantum wells of a second depth. The first means is formed adjacent the second means such that impinging energy in the second spectral band first passes through the first means before reaching the second means. The second quantum well 140 is further is layered over a third means responsive to impinging energy, or radiation, of a third spectral band, represented in the FIG. 1 embodiment as third quantum well layer 145. Quantum well layer 145 comprises one or more quantum wells of a third depth. The second means is formed adjacent the third means such that impinging energy in the third spectral band first passes through the second means before reaching the third means.

Using known molecular beam epitaxy (MBE) techniques, the layers of the detector 100 shown in FIG. 1 can be fabricated using the following exemplary process. First, an etch stop layer 110 is formed using a material such as AlGaAs, for example, and then a first contact layer 115, doped to a first conductivity, is formed upon the etch stop layer 110. Next, a first quantum well layer 105 comprising one or more quantum wells of a depth corresponding to a first desired peak wavelength is formed over the first doped contact layer 115. This first quantum well layer 105 can include multiple sublayers composed of alternating barrier sublayers and quantum well sublayers. A second contact layer 120, doped to a second conductivity, is next formed upon the first quantum well layer 105.

An insulating layer 125 is then formed upon the second doped contact layer 120. The insulating layer 125 can be composed, for example, of undoped GaAs, SiO, $SiO_2$, ZnS, or $MgF_2$. One skilled in the art will recognize, however, that other suitable insulating materials can be used. A third contact layer 130, doped to a third conductivity, next formed upon the insulating layer 125.

The top two quantum well layers 140, 145 are subsequently formed on the third doped contact layer 130. The second quantum well layer 140 comprising one or more quantum wells of a depth corresponding to a second desired peak wavelength is first formed on the third doped contact layer 130, followed by a fourth contact layer 135, doped to a fourth conductivity. A third quantum well layer 145 comprising one or more quantum wells of a depth corresponding to a third desired peak wavelength is then formed on the fourth doped contact layer 135. A fifth contact layer 150, doped to a fifth conductivity, is formed on top of the third quantum well layer 145. The fifth contact layer 150, and contact layers 115, 120, 130, and 135 can be composed of, for example, doped GaAs (e.g., n+GaAs), though one skilled in the art will recognize that other suitable contact layer materials may be used.

Quantum well layers 105, 140, and 145 can be comprised of, for example, 20-period $GaAs/Al_xGa_{1-x}As$ multi-quantum well stacks with the GaAs well depths and Al compositions adjusted to yield the desired peaks and spectral widths. One skilled in the art will recognize, however, that other multi-quantum well layers can be used to produce the desired peaks and spectral widths of the different quantum well layers of the detector. For example, the quantum well layers disclosed in U.S. Pat. No. 5,539,206 to Schimert, which discloses multi-quantum wells with material parameters adjusted to produce a 9 μm peak spectral response, or disclosed in "Two-color Infrared Photodetector Using GaAs/AlGaAs and Strained InGaAs/AlGaAs Multiquantum Wells," (Tsai et al., Appl. Phys. Lett. 62 (26), Jun. 22, 1998), which discloses multi-quantum wells with material parameters adjusted to produce 5 μm and 8 μm peak spectral responses, or disclosed in "Double Wavelength Selective GaAs/AlGaAs Infrared Detector Device," (Köck et al., Appl. Phys. Lett. 60 (16), Apr. 20, 1992), which discloses multi-quantum wells with material parameters adjusted to produce 7 μm and 11 μm peak spectral responses, could be used in the present invention. The disclosures of the above cited documents are herein incorporated by reference. Additionally, one skilled in the art will further recognize that various doping concentrations for the quantum wells and contact layers can be used in exemplary embodiments of the invention. For example, doping concentrations such as those disclosed in the above-identified U.S. Patent to Schimert can be used in the present invention. Furthermore, the formation of each layer of the detector can be performed using any conventional techniques appropriate for the layer being established including, but not limited to, growth or deposition techniques.

Referring to FIG. 1, the electrical connections for interfacing between the detector structure 100 and the Read Out Integrated Circuit (ROIC) (not shown) of one exemplary embodiment can be seen. As illustrated in the Figure, a common contact 155 is connected between the doped contact layer 115 on one side of the first quantum well layer 105 and the doped contact 135 layered between the two quantum well layers 140, 145. Common contact 155 is additionally connected to the detector's common bias voltage (labeled DETCOM) of the ROIC. Additionally, individual detector bias voltages are provided via electrical contacts 160, 165, and 170 to contact layers 150, 130, and 120, respectively, to thereby access each band separately. The difference between the common bias voltage and the individual bias voltages supplied by the ROIC to each of the electrical contacts 160, 165, and 170 establishes different bias voltages across each of the quantum well layers 105, 140, and 145 of the detector. Electrical contacts 160, 165, and 170, each being associated with a different one of the quantum well layers 145, 140, and 105, thus provide means for biasing each band independently in conjunction with the individual bias voltages supplied by the ROIC. During operation, contacts 160, 165, and 170 constitute outputs of the detector which supply photocurrent from each quantum well to the ROIC circuitry associated with each vertically stacked detector. Electrical contacts 160, 165, and 170 can be, for example, formed as Indium "bumps," or as any conventional contact known to those skilled in the art.

In the exemplary embodiment of FIG. 1, the contact layers 115 and 135 are tied to the common bias voltage DETCOM externally, via indium bumps, to an appropriate pattern on the read out circuit. This exemplary embodiment therefore includes five bumps per pixel. In an exemplary embodiment illustrated in FIG. 2, the contact layer 135 is tied internally to DETCOM by shorting the layer to the contact layer 115 on one side of the quantum well layer 105 by means of a combination of a dielectric isolation layer 200 and a gold metal run 205. This exemplary embodiment thus requires four bumps per pixel.

Figure 2:
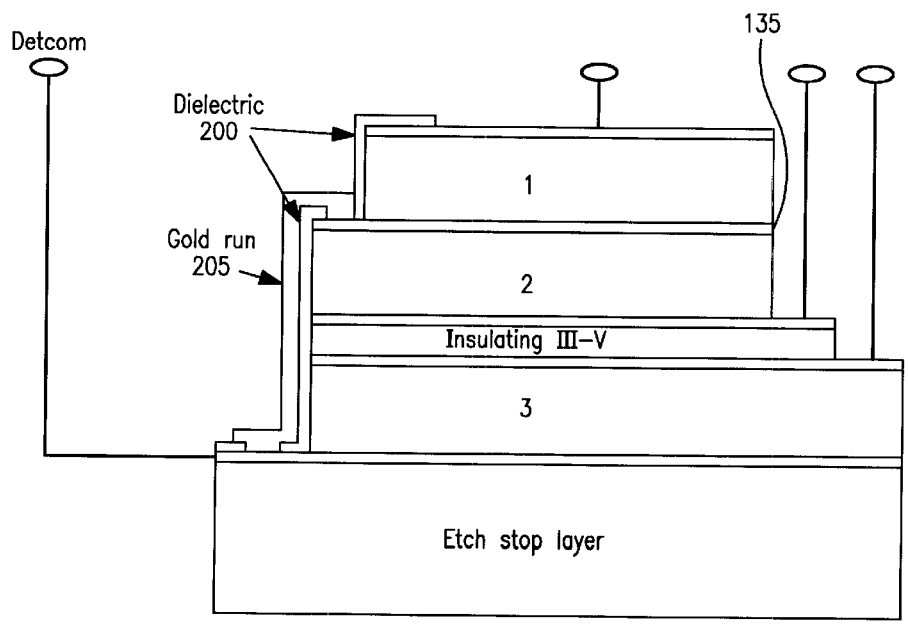
FIG. 2 is a structural diagram of a three color quantum well detector in accordance with another exemplary embodiment of the present invention.

In the exemplary embodiments of FIG. 1 and 2, the lower contact 115 need not be isolated from the quantum well layer 105 for each individual pixel. For example, the lower contact layer 115 can be common to the entire array and be connected to DETCOM externally at the multiplexer level. This approach would advantageously reduce the number of bumps to one for each color, or three per pixel.

Figure 3:
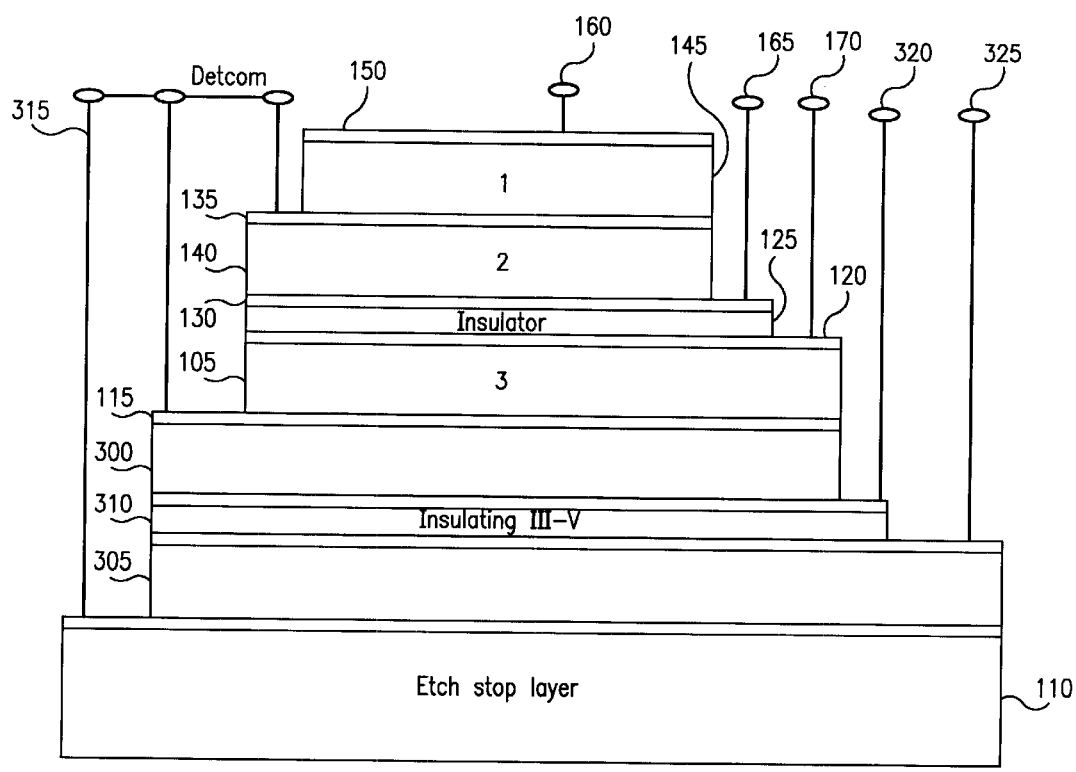
FIG. 3 is a structural diagram of a five color quantum well detector in accordance with an exemplary embodiment of the invention.

One skilled in the art will recognize that the three color, three quantum well layer structure illustrated in FIGS. 1 and 2 can be modified to include more than three quantum well layers by appropriately spacing insulating layers within the detector. For example, the embodiment of FIG. 1 has been modified as shown in FIG. 3 to provide a five color detector structure. This structure includes additional quantum well layers 300 and 305 and an additional insulating layer 310. ROIC interface connections 315, 320, and 325 are additionally included for providing separate biases to the fourth and fifth colors quantum well layers 300, 305 of the detector. It will be recognized by those skilled in the art that adding additional quantum well layers beyond the fifth layer shown in FIG. 3 will entail additional contact layers, insulating layers, and ROIC interface connections (e.g., conductive bumps).

Figure 4:
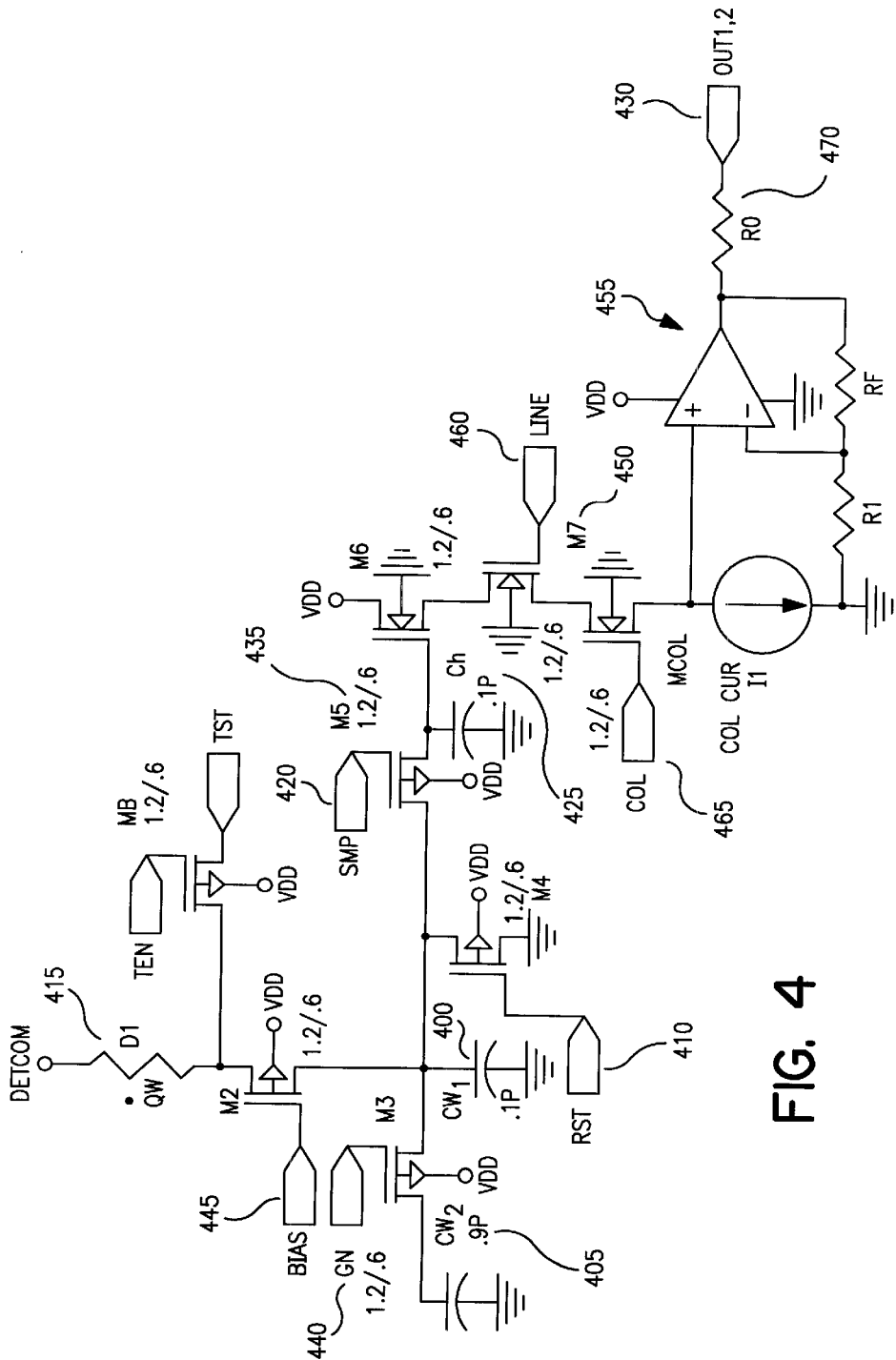
FIG. 4 is a schematic of the read out circuit in accordance with an exemplary embodiment of the invention.

A read out circuit which can be used in an exemplary embodiment of the invention is illustrated in FIG. 4. This circuit performs a number of advantageous functions in the photon detection and read out process. One function performed is integration of the detector output for the duration of the next image frame while the current image frame is being "read" at the output of the read out circuit. Every collected signal photon in the detector is precious when an infrared source (that is, the source to be imaged by the detector) is at a great distance. By integrating over the full frame time, the maximum number of electrons is collected.

Referring to FIG. 4, integration of the quantum well output for the each image frame is performed by charge well capacitances $C_{w1}$ 400, $C_{w2}$ 405, and reset (RST) voltage 410. Application and removal of RST voltage 410 permits the charge well capacitances to charge and discharge the electrons from the quantum well, thus integrating the quantum well output. The integrated output of the quantum well is then selectively applied to the subsequent sample and hold circuitry by sample (SMP) switching voltage 420. Storage capacitor $C_h$ 425 stores the integrated output of the quantum well to provide the read out for the current image frame at $Out_{1,2}$ 430. The dump, ramp, and sample process performed by the RST voltage 410, the charge wells $C_{w1}$ 400 and $C_{w2}$ 405, the quantum well detector resistance 415, and the storage capacitance $C_h$ 425 emulates an ideal noise filter if the charge well and storage capacitor sizes are properly selected. A signal to noise improvement equal to the square root of three is available with this technique.

The integration process also performs a second advantageous function—a "non-destructive" read. A "non-destructive" read occurs because the electron charge stored in the storage capacitor $C_h$ 425 is not removed until this capacitor is electrically connected in parallel with the charge well $C_{w1}$ 400 and $C_{w2}$ 405. When the sample SMP voltage 420 is applied at the gate of M5 435, the electrical connection between the charge well and the storage capacitor is made and "charge sharing" occurs. This "charge sharing" produces a mild image smoothing effect.

A third advantageous function performed by the exemplary read out circuit of FIG. 4 is the improvement of the gain and dynamic range of the read out circuit through the use of two charge wells. When detecting faint sources at long ranges, the number of volts per electron becomes a significant factor and signal to noise ratios thus become critical. As a heat source gets closer, the need changes from the need for maximizing the noise to avoiding saturation due to the very large number of electrons rapidly filling the charge well. The exemplary read out circuit of FIG. 2 solves this problem by augmenting the integration time through a change in the charge well capacitance. This is illustrated in FIG. 4 by the use of the two charge well capacitances $C_{w1}$ 400 and $C_{w2}$ 405. Application of a gain switching voltage GN 440 switches in the smaller charge well capacitance $C_{w2}$ 405 to add, for example, another twenty decibels of dynamic range to the system's performance. A high total dynamic range performance, for example, with 128 decibels can thus be realized (68 dB small well, 40 dB integration time modulation, and 20 dB well change).

A fourth advantageous function of the read out circuit is the balancing of the output voltage response for each of the colors through the use of independent bias adjustment. Balance is achieved by allowing independent bias adjustment for each color, thus permitting a uniform output voltage response for each of the colors for any given background photon flux. This adjustment is shown in FIG. 4, as the BIAS input 445.

An additional advantageous function of the read out circuit is the removal of distortions in low level signals, due to current flowing in the ground reference, by the use of full difference mode outputs. Most power supply noise, ground noise, and induced pickup occurs as common mode noise. The use of difference amplifiers allows these signals to be removed by subtraction. Difference amplifiers are well known in the art and thus have been omitted from the circuitry depicted in FIG. 4.

Another advantageous function of the read out circuit is the elimination of electronic cross coupling. Electronic cross coupling can be avoided by having each color of the detector use its own time division multiplexer and output port. Since most electronic cross talk in time division multiplexers is capacitive, use of very low driving point impedance in the line and column process is important in holding down the temporal-spectral cross talk. This is particularly the case in high speed applications with wide dynamic range requirements. These characteristics can be achieved, as shown in FIG. 4, through the use of the dual FET M7 450 and push/pull operational amplifier 455. The dual FETs 450 open or close based on time division multiplexing voltages LINE 460 or COLUMN 465. The LINE 460 voltage is used to access a line of cells in the focal plane array and the COLUMN 465 voltage accesses a column of cells in the focal plane array. The push/pull operational amplifier 455 additionally sets the voltage gain of the output circuit to the following relationship:

$$\frac{V_o}{V_i} = \frac{R_F}{R_I\left(1 + \frac{R_F}{R_I}\right)} \qquad \text{Eqn. (6)}$$

The driving point impedance is further set by the resistor $R_o$ 470.

In an alternate exemplary embodiments of the invention, higher density focal plane arrays can be produced by removing the charge wells from the ROIC and fabricating the charge wells within the detector structure itself. The smaller pitch required of higher density arrays limits the usable area available for the charge wells in the ROIC underlying the detector structure. By fabricating the charge wells integrally to the detector itself, less space is required in the underlying ROIC and therefore higher densities can be achieved in the array. The technique of using integral charge wells is disclosed in U.S. patent application Ser. No. 09/149,483, entitled "Integral Charge Well for QWIP FPA's," the disclosure of which is herein incorporated by reference.

Optical coupling, in accordance with exemplary embodiments of the invention, can be achieved using a number of different techniques. Principles of quantum selection require that incident electromagnetic fields propagate in the horizontal plane of the quantum well. The incident flux must therefore be reflected inside the quantum well at an angle such that the flux passes through the material many times. In one exemplary embodiment, a rotated waffle diffraction grating is used, where the width of the waffle corresponds to one wavelength, the length of the waffle to another, and the diagonal to a third wavelength. The waffle grating, combined with a top side grating and side wall reflecting mirrors, constitute the optimum "photon in a box" quantum well detector optical system. Additionally, the waffle grating can be enhanced with a flux entry side anti-reflective coating composed of, for example, a quarter wavelength dielectric material. In addition to the waffle grating, one skilled in the art will recognize that a number of different techniques can be used for achieving optical coupling in the present invention. Such techniques include use of random gratings, reflectors, resonance structures, and so forth.

As one skilled in the art will recognize, a plurality of the vertically stacked detector structures described in the exemplary embodiments above can be formed across an etch stop layer to provide a detector structure array. This array will serve as a focal plane for optics of an IR imaging system. Such optics are conventionally known in the art and are not described here.

One skilled in the art will additionally recognize that the detector and ROIC can be fabricated as integral structures in the focal plane array. Using this fabrication technique, the detector and read out circuitry can be fabricated as a unitary structure, thus removing the need for aligning the detector array structure and the ROIC array structure so as to connect each ROIC, via conductive bumps, with its associated detector across the array.

The exemplary embodiments of the invention described herein can be used in numerous applications. One application in which the exemplary embodiments can be applied is the recognition and characterization of infrared sources such as gray body infrared sources. Measurement of the temperature of a remote source using long wavelength infrared signatures is commonly accomplished through the use of two infrared detectors. Each detector is optically filtered such that their peak responses are at different wavelengths or colors within the same band. By taking the flux response ratios, the temperature of the source can be determined. This approach works fine if the only photon flux is the radiated flux of the source. The method, however, is not effective when the source is a gray body, and not a black body, that not only emits in the infrared region, but reflects as well. If the source is very far away, relatively cool, and illuminated by an external black body source the gray body source will exhibit two temperatures. First, there will be the temperature of the source itself, which is dependent on the transmittance of the surface of the source. Additionally, there is the temperature of the external black body and its temperature, which depends on the reflectance of the source. Generally, the external black body radiator will be the earth, whose atmosphere has a window that extends from 8 to 12 microns and blocks radiation at 14 microns.

A resolution to the problem of gray body characterization and recognition is to use a third color that does not "see" the radiation from the external black body radiator. Assuming an unknown gray body with an emissivity, τ, of effective cross sectional area, A, that possesses an absolute temperature, T, the photon flux emitted by such a body is represented by the following:

$$\Phi_{pL}(T) = 2\pi cA\tau \int_{\lambda_L}^{\lambda_H} \frac{1}{\lambda^4 \left(e^{\frac{hc}{kT\lambda}} - 1\right)} d\lambda \qquad \text{Eqn. (7)}$$

where c is the velocity of light $2.9979*10^8$ meters per second;

A is the effective cross sectional area of the object or target in square meters;

$\tau$ is the emissivity or transmissibility of the objects surface ($0 \leq \tau \leq 1$);

h is Planck's constant $6.626*10^{-34}$ joule*seconds;

$\lambda$ is the spectral wave length range in meters;

k is Botzmann's constant $1.3802*10^{-23}$;

T is the absolute temperature of the object in Kelvin;

$\lambda_H$ and $\lambda_L$ are the upper and lower spectral band edges respectively in meters The observed bands are relatively narrow with respect to the arithmetic center of the pass band. Due to this narrow response, the integral can be evaluated using the trapezoidal rule of calculus. The expression thus becomes:

$$\Phi_{pL}(T) = \frac{2\pi cA\tau\lambda_B}{\lambda_p^4 \left(e^{\frac{hc}{kT\lambda_p}} - 1\right)} \text{ photons/second} \qquad \text{Eqn. (8)}$$

where $\lambda_p$ is the arithmetic mean between the upper and lower cut off wave lengths in meters and $\lambda_B = \lambda_H - \lambda_L$ is the pass band in meters.

At the wavelengths and temperatures of interest, the exponential term in the above equation corresponds to a value much greater than one which reduces the complexity to a more compact form with very little loss in accuracy. For instance, at 8.6 microns and 300 Kelvin the exponential term evaluates to 265.4, which represents only a 0.38% error in the computation. Using this approximation reduces the equation to:

$$\Phi_{pL}(T) = \frac{2\pi cA\tau\lambda_B e^{-\frac{hc}{kT\lambda_p}}}{\lambda_p^4} \qquad \text{Eqn. (9)}$$

In the case of quantum well detectors, the pass band to peak response is, in general, a constant for a given process. A 1:8 ratio is typical. Using this ratio, the expression is further simplified to the form $$\Phi_{pL}(T) = 0.25\pi cA\tau\lambda_p^{-3} e^{-\frac{hc}{kT\lambda_p}} \qquad \text{Eqn. (10)}$$

The above form is useful in calculations involving multiple spectra detectors. One further simplification is to reduce the exponential argument by replacing the $hc/k\lambda_p$ term with an algebraic equivalent as follows:

$$\Phi_{pL}(T) = 0.25\pi cA\tau\lambda_p^{-3} e^{-\frac{T_p}{T}} \qquad \text{Eqn. (11)}$$

where $T_p = hc/k\lambda_p$ in Kelvin and will be called the color temperature of the detector.

To find the collected photon flux, the point target is assumed to be lambertian such that radiation is independent of the viewing angle, the energy is assumed to distribute over a hemisphere of radius angle R in meters, and an optical aperture of diameter D is assumed. The following expression represents the collected photon flux:

$$\Phi_p(T) = 0.03\pi cAd^2\tau\lambda_p^{-3}R^{-2}e^{-\frac{T_p}{T}} \qquad \text{Eqn. (12)}$$

The unknown variables of the source are effective cross sectional area, range, emissivity, and temperature. The purpose of a multi-spectral system is to identify information about the source, the most important parameters being relative range and temperature.

Assuming a detector with three colors, blue (B), green (G), and red (R), with peak wavelengths selected at 8.6, 11.2, and 14 microns, respectively, the algebraic short hand for these colors are the following:

$$\Phi_G(T) = 0.03\pi cAd^2\tau\lambda_G^{-3}R^{-2}e^{-\frac{T_G}{T}} \qquad \text{Eqn. (13)}$$

$$\Phi_B(T) = 0.03\pi cAd^2\tau\lambda_B^{-3}R^{-2}e^{-\frac{T_B}{T}} \qquad \text{Eqn. (14)}$$

$$\Phi_R(T) = 0.03\pi cAd^2\tau\lambda_R^{-3}R^{-2}e^{-\frac{T_R}{T}} \qquad \text{Eqn. (15)}$$

Without considering the glow of the earth, the above equation set produces the temperature of the source by taking the log of the ratios of any two colors. By using successive frames the relative range is established by taking the square root of the ratio of the successive frame data. The temperature solution is:

$$T = \frac{(T_B - T_G)}{\ln \lambda_G^3 \frac{\Phi_G}{\lambda_B^3 \Phi_B}} \qquad \text{Eqn. (16)}$$

The relative range is:

$$\frac{R_1}{R_2} = \frac{\Phi_G(t_1)}{\Phi_G(t_2)} \qquad \text{Eqn. (17)}$$

where t represents time and the subscript represents successive frames.

The above analysis represents a simplified but reasonably accurate representation of the received flux levels as emitted by a relatively cool gray body lambertian point source. If this source is in a near earth trajectory, however, then the black body equivalent glow of the earth will reflect on the surface of the source. This reflection would be added to the emitted photon flux from the source. Various black body models for the earth as an equivalent black body exist and most model the earth as a 300 Kelvin black body. These models have spectral distributions that are the same as the transmission spectrum in the atmosphere. This spectral distribution includes "windows" in the mid and long infrared wave bands. For the colors selected, the green and blue bands are in the long wave length window, whereas the red is not.

Adding earth glow reflectance to the above expression produces the following results:

$$\Phi_B(T) = \qquad\qquad\text{Eqn. (18)}$$
$$0.03\pi cAd^2\tau\lambda_B^{-3}R^{-2}e^{-\frac{T_B}{T}} + 0.03\pi cAd^2(1-\tau)\lambda_B^{-3}R^{-2}e^{-\frac{T_B}{T_e}}$$

$$\Phi_G(T) = \qquad\qquad\text{Eqn. (19)}$$
$$0.03\pi cAd^2\tau\lambda_G^{-3}R^{-2}e^{-\frac{T_G}{T}} + 0.03\pi cAd^2(1-\tau)\lambda_G^{-3}R^{-2}e^{-\frac{T_G}{T_e}}$$

$$\Phi_R(T) = \qquad\qquad\text{Eqn. (20)}$$
$$0.03\pi cAd^2\tau\lambda_R^{-3}R^{-2}e^{-\frac{T_R}{T}} + 0.03\pi cAd^2(1-\tau)\lambda_R^{-3}R^{-2}e^{-\frac{T_R}{T_e}}$$

where $T_e$ is the earth's equivalent black body temperature.

Cross coupling between the emissivity and the temperature make analytic solutions for the target temperature and the relative range impossible. However, an alternative solution is to make parametric sweeps of the data. The parametric sweep can be examined by specifying a set of reasonable parameters. For example, these can include a cross sectional area of one square meter, a range of 100,000 meters, an optical diameter of 0.25 meters, and an earth glow of 300 Kelvin. With these values, the equation set now becomes $$\Phi_B(T,\tau) = 2.78*10^{11}\left(\tau e^{(-1674/T)} + \frac{1-\tau}{265}\right) \qquad \text{Eqn. (21)}$$

$$\Phi_G(T,\tau) = 1.26*10^{11}\left(\tau e^{(-1286/T)} + \frac{1-\tau}{72.65}\right) \qquad \text{Eqn. (22)}$$

$$\Phi_R(T,\tau) = 0.643*10^{11}\tau e^{-1029/T} \qquad \text{Eqn. (23)}$$

$$\Phi_R(T,\tau) = 0.643*10^{11}\tau e^{-1029/T} \qquad \text{Eqn. (23)}$$

The above equations clearly demonstrate the cross coupling of the equation set between the emissivity, $\lambda$, and the source temperature, T. Selecting a source temperature, 270 Kelvin, the equation set becomes:

$$\Phi_B(270,\tau) = 1.05*10^9(1-0.382\tau) \qquad \text{Eqn. (24)}$$

$$\Phi_G(270,\tau) = 1.73*10^9(1-0.379\tau) \qquad \text{Eqn. (25)}$$

$$\Phi_R(270,\tau) = 1.43*10^9\tau \qquad \text{Eqn. (26)}$$

As can be seen from equations 23, 24, and 25 the relative ratio of the three colors will change with emissivity. The green and blue colors actually increase as the reflectivity increases. In contrast, the red color decreases with decreasing emissivity. Since the relative ratios of the three colors will vary depending on properties of the infrared source, the relative ratios of the three colors can be used for characterizing or recognizing the infrared source. The above described method is thus advantageous for characterizing a gray body radiation source that reflects, as well as emits, radiation in the infrared region.

An additional application of exemplary embodiments of the invention is the differentiation of the spectrums emitted by an infrared source in the near, mid, and long atmospheric transmission windows. If a three color infrared focal plane array could be constructed to "see" the near, mid, and long wave bands, than the near band would see visible features such as flares, lamps, and solar illuminated objects; the mid wave band would pick up hot objects and features while providing good contrast for these features; and the long wave would provide the cold object features and bad weather vision.

Exemplary embodiments of the invention can additionally by used for correlating signatures of a known source in each band so that signal noise improvement is achieved. Since the noise is not correlated, and the signatures are correlated, then summing increases the signal linearly while the noise only increases as the root of the sum of the squares. Hence, summing the frames of three colors increases the signal to noise ratio by the square root of three. This improves the range by about thirty two percent. Furthermore, fixed spatial pattern noise and low frequency pattern noise can be extracted from the scene data because these noise sources are correlated between the arrays and can be removed prior to observation and evaluation of a source. Additionally, the cross correlation coefficient used to remove spatial pattern noise improves as well with three colors.

A further application of exemplary embodiments of the invention involves hyper-spectral analysis. Many identification problems arise with infrared because two objects may have an equivalent broad band black body signature and as such are not observable. Hyper spectral analysis takes advantage of the fact that different surfaces and hot gases have different spectral signatures. Indeed, near infrared spectral analysis has become a standard technology for chemical gas analysis. Automotive exhausts have been analyzed with infrared spectral data. Environmental and smoke stack analysis have enjoyed similar successes. While the entire spectrum cannot be produced with a three color multiple quantum well focal plane array, a color equivalent can be produced by the weighted sum of the spectral lines. Given forty shades of gray, three colors will produce 64,000 equivalent colors, which provides much the same information. Such a system can be made in the mid or long wave bands or even a combination.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A photodetector comprising:
   a first photosensitive layer;
   a second photosensitive layer formed adjacent the first photosensitive layer;
   a third photosensitive layer;
   a first insulating layer interposed between and adjacent to said second and third photosensitive layers; and
   means for independently biasing said first, second, and third photosensitive layers.

2. The photodetector of claim 1, wherein said first, second, and third photosensitive layers are responsive to radiant energies in different spectral bands.

3. The photodetector of claim 1, wherein said first, second, and third photosensitive layers comprise quantum well layers.

4. The photodetector of claim 3, wherein each of said first, second, and third quantum well layers comprise one or more quantum wells having associated depths.

5. The photodetector of claim 4, wherein said depths are selected on the basis of desired peak wavelengths.

6. The photodetector of claim 1, wherein said means for biasing comprises:
   a plurality of electrical contacts for establishing different bias voltages across each of the photosensitive layers, wherein each of said plurality of contacts is associated with a different one of said photosensitive layers.

7. A photodetector comprising:

a first photosensitive layer;

a second photosensitive layer;

a third photosensitive layer, wherein said photosensitive layers are formed adjacent one another;

means for independently biasing said first, second, and third photosensitive layers;

a first contact layer of a first conductivity formed on a first surface of said first photosensitive layer;

a second contact layer of a second conductivity formed on a second surface of said first photosensitive layer;

an insulating layer formed on the second contact layer;

a third contact layer of a third conductivity formed on the insulating layer;

a fourth contact layer of a fourth conductivity formed on the second photosensitive layer; and a fifth contact layer of a fifth conductivity formed on said third photosensitive layer, wherein said second photosensitive layer is formed on said third contact layer and wherein said third photosensitive layer is formed on said fourth contact layer.

8. The photodetector of claim 7, comprising a first electrical contact connected to said first and said fourth contact layers.

9. The photodetector of claim 8, wherein said first electrical contact is further connected to a common bias voltage.

10. The photodetector of claim 7, comprising second, third, and fourth electrical contacts connected to said first, third, and fifth contact layers.

11. The photodetector of claim 8, wherein each of said second, third and fourth electrical contacts is further connected to detector bias voltages.

12. The photodetector of claim 7, comprising a metallic layer connected to said fourth and said first contact layers.

13. The photodetector of claim 12, comprising an electrical contact connected between said first contact layer and a common bias voltage.

14. The photodetector of claim 1, wherein said first photosensitive layer provides a first photocurrent in a first spectral band, said second photosensitive layer provides a second photocurrent in a second spectral band, and said third photosensitive layer provides a third photocurrent in a third spectral band.

15. The photodetector of claim 14, comprising:

means for integrating said first, second, and third photocurrents independently of one another.

16. A photodetector comprising:

first means responsive to impinging energy of a first spectral band for providing a first quantity of moving charges to a first output of said photodetector;

second means responsive to impinging energy of a second spectral band for providing a second quantity of moving charges to a second output of said photodetector, wherein said impinging energy of said second spectral band first passes through said first means before reaching said second means;

a first insulating layer interposed between and adjacent to said first and second means; and third means responsive to impinging energy of a third spectral band for providing a third quantity of moving charges to a third output of said photodetector, wherein said impinging energy of said third spectral band first passes through said second means before reaching said third means.

17. A photodetector array comprising:

a plurality of photodetector structures, each comprising:

a first photosensitive layer;

a second photosensitive layer formed adjacent the first photosensitive layer;

a third photosensitive layer;

a first insulating layer interposed between and adjacent to said second and third photosensitive layers; and means for independently biasing said first, second, and three or more photosensitive layers.

\* \* \* \* \*